(12) United States Patent
Chen et al.

(10) Patent No.: US 8,251,494 B2
(45) Date of Patent: Aug. 28, 2012

(54) BONDABLE PRINTED WIRING WITH IMPROVED WEAR RESISTANCE

(75) Inventors: Samuel Chen, Penfield, NY (US); Charles I. Levey, West Henrietta, NY (US)

(73) Assignee: Eastman Kodak Company, Rochester, NY (US)

( * ) Notice: Subject to any disclaimer, the term of this patent is extended or adjusted under 35 U.S.C. 154(b) by 345 days.

(21) Appl. No.: 12/627,133

(22) Filed: Nov. 30, 2009

(65) Prior Publication Data

US 2011/0128325 A1 Jun. 2, 2011

(51) Int. Cl.
*B41J 2/14* (2006.01)
*B41J 2/16* (2006.01)
(52) U.S. Cl. ............................................. 347/50; 347/58
(58) Field of Classification Search .................... 347/40, 347/42, 43, 50, 58, 64, 67
See application file for complete search history.

(56) References Cited

U.S. PATENT DOCUMENTS

| | | | |
|---|---|---|---|
| 5,910,644 A | 6/1999 | Goodman et al. | |
| 6,139,977 A | 10/2000 | Abys et al. | |
| 6,519,845 B1 | 2/2003 | Cutting et al. | |
| 6,641,254 B1 * | 11/2003 | Boucher et al. | 347/50 |
| 6,776,475 B2 * | 8/2004 | O'Hara | 347/50 |
| 2006/0008970 A1 | 1/2006 | Oggioni et al. | |

FOREIGN PATENT DOCUMENTS

EP 0 884 935 A2 12/1998
EP 1 204 302 A1 5/2002

OTHER PUBLICATIONS

Schulze N: "Palladium Als Diffusionssperre—ein Weg zur multifunktionalen Leiterplattenoberfläche", Galvanotechnik, Eugen G. Leuze Verlag, Saulgau/Wurtt, DE, vol. 98, No. 9, Sep. 1, 2007, pp. 2096-2102, XP-001507496, ISSN: 0016-4232, the whole document.

* cited by examiner

*Primary Examiner* — Thinh Nguyen
(74) *Attorney, Agent, or Firm* — Peyton C. Watkins

(57) ABSTRACT

A printed wiring member includes a dielectric substrate; a patterned copper layer formed on the dielectric substrate. The patterned copper layer includes i) contact pads for wire bonding; ii) connector pads for making electrical connection with an electrical connector; and iii) conductor traces between contact pads and corresponding connector pads. A nickel coating is formed on the contact pads and the connector pads, and a gold layer is formed on the nickel coating on the contact pads and the connector pads. A palladium deposit is formed on the gold layer on at least the connector pads.

24 Claims, 8 Drawing Sheets

BONDABLE PRINTED WIRING WITH IMPROVED WEAR RESISTANCE

CROSS-REFERENCE TO RELATED APPLICATION

Reference is made to commonly assigned, copending U.S. patent application Ser. No. 12/627,161, filed Nov. 30, 2009 by Samuel Chen, et al., entitled "Method of Making Bondable Printed Wiring Member".

FIELD OF THE INVENTION

The present invention relates generally to a printed wiring member having wire-bondable contact pads and wear resistant connector pads, and more particularly to a printed wiring member for an inkjet printhead.

BACKGROUND OF THE INVENTION

Printed wiring members are commonly used as ways to electrically interconnect electronic components in low cost fashion. Some types of printed wiring members are designed for direct interconnection to semiconductor chips by, for example, wire bonding or tape automated bonding. Furthermore, some types of printed wiring members are designed to have connector pads that are intended to disconnectably mate multiple times with an electrical connector that connects the printed wiring member with other circuitry in an electronic system. An example of a printed wiring member that both directly interconnects to a semiconductor chip and also has disconnectable connection pads is an inkjet printhead. In this example, the semiconductor chip is the inkjet printhead die, which typically contains the nozzles, the drop forming mechanisms to eject drops from the nozzles, and electronics associated with the drop forming mechanisms. Because printheads typically do not last the entire lifetime of the printer, many types of printheads are designed to be disconnectable from the printer to allow replacement.

Although nominally a printhead would only need to be installed and uninstalled once, it is preferable to design the printhead connector pads to withstand more than 10-20 installation cycles in order to improve reliability of the system. One well-known way of making connector pads reliably connectable for many cycles is to provide a top metallization of hard gold on the connector pads. Hard gold (around 99.7% pure) is made hard during the plating process by adding cobalt and/or nickel at levels of approximately 0.1% to 0.3%. As is well-known in the art, however, hard gold is not readily wire-bondable. In order to provide a printed wiring member with bondable gold at the contact pads and wear resistant gold at the connector pads, one approach would be to do two separate masking and plating steps to provide soft gold (around 99.9% pure) at the contact pads and hard gold at the connector pads, but this is relatively costly.

U.S. Pat. No. 5,910,644 discloses metallization electroplated onto the copper contact pads and connector pads of a printed wiring member having both good bondability and good wear resistance. The disclosed metallization includes 80-200 microinches (2-5 microns) of nickel plated onto the copper, nominally 35 microinches (0.9 micron) of palladium plated onto the nickel, and 5-30 microinches (0.1-0.75 micron) of soft gold plated onto the palladium. The high purity soft gold provides for high yield wire bonding while the palladium ensures adequate wear resistance to provide stable electrical connection in the event that wear through of the soft gold surface finish of the connector pads can occur. A drawback of this process is that relatively thick layers of the costly palladium and high purity gold are required.

Marketplace competitive pressures require that inkjet printheads have high reliability at low cost. Therefore, there exists a need for a printed wiring member that provides reliable bondability, wear resistant connector pads for repetitive printhead installations, and low cost. Furthermore, because an inkjet printhead commonly has the printhead die (and associated wire bond pads) located on one surface, and the connector pads located on a different surface of the printhead, a flexible printed wiring member having reliable bondability, wear resistance, and low cost is needed.

SUMMARY OF THE INVENTION

The present invention is directed to overcoming one or more of the problems set forth above. Briefly summarized, according to one aspect of the invention, the invention resides in a printed wiring member comprising: a) a dielectric substrate; b) a patterned copper layer formed on the dielectric substrate, the patterned copper layer including: i) contact pads for wire bonding; ii) connector pads for making electrical connection with an electrical connector; and iii) conductor traces between contact pads and corresponding connector pads; c) a nickel coating formed on the contact pads and the connector pads; d) a gold layer formed on the nickel coating on the contact pads and the connector pads; and e) a palladium deposit formed on the gold layer on at least the connector pads.

DETAILED DESCRIPTION OF THE INVENTION

Figure 1:
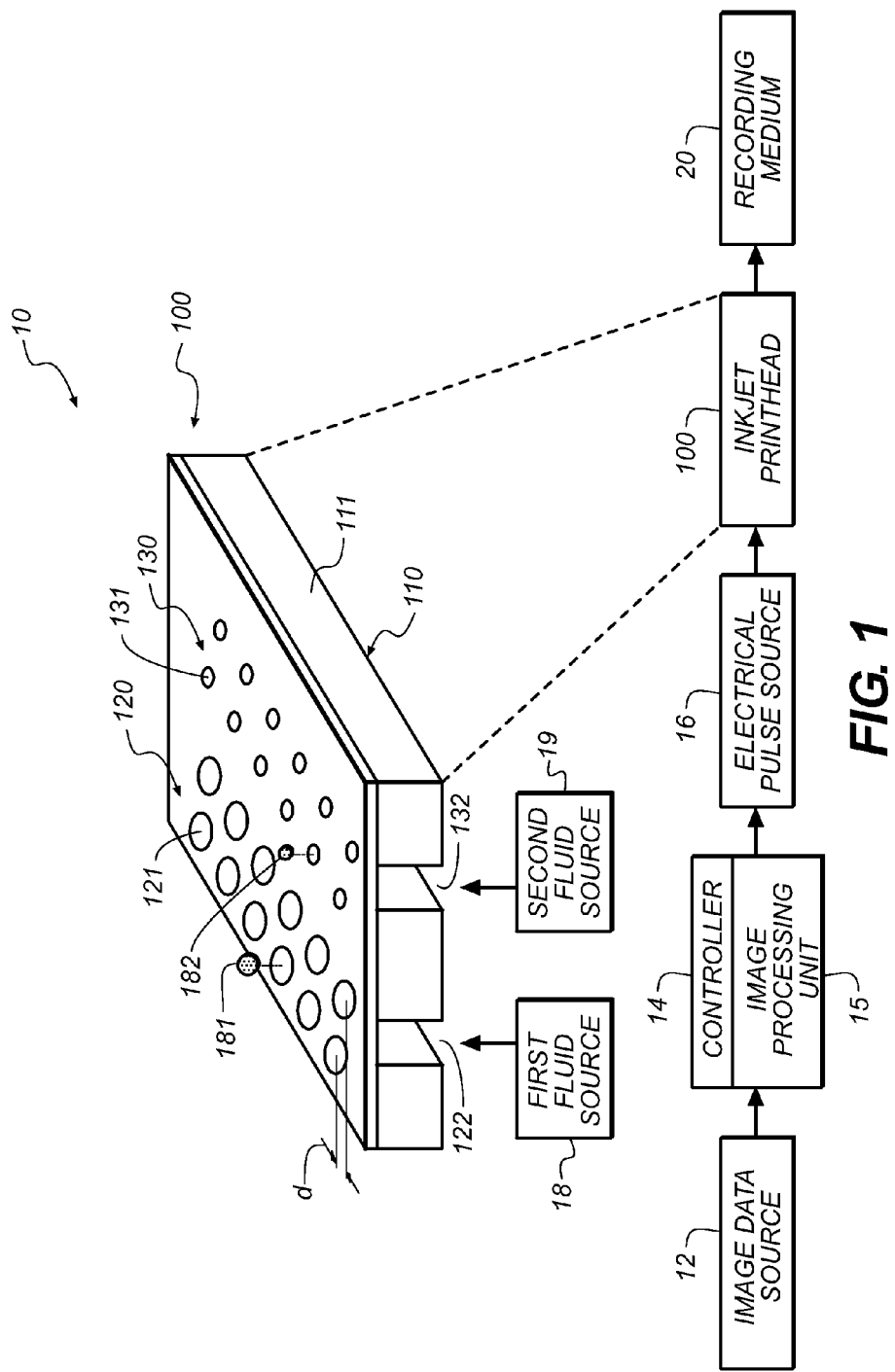
FIG. 1 is a schematic representation of an inkjet printer system of the present invention.

Referring to FIG. 1, a schematic representation of an inkjet printer system 10 is shown, for its usefulness with the present invention and is fully described in U.S. Pat. No. 7,350,902, and is incorporated by reference herein in its entirety. Inkjet printer system 10 includes an image data source 12, which provides data signals that are interpreted by a controller 14 as being commands to eject drops. Controller 14 includes an image processing unit 15 for rendering images for printing, and outputs signals to an electrical pulse source 16 of electrical energy pulses that are inputted to an inkjet printhead 100, which includes at least one inkjet printhead die 110.

In the example shown in FIG. 1, there are two nozzle arrays. Nozzles 121 in the first nozzle array 120 have a larger opening area than nozzles 131 in the second nozzle array 130. In this example, each of the two nozzle arrays has two staggered rows of nozzles, each row having a nozzle density of 600 per inch. The effective nozzle density then in each array is 1200 per inch (i.e. $d = \frac{1}{1200}$ inch in FIG. 1). If pixels on the recording medium 20 were sequentially numbered along the paper advance direction, the nozzles from one row of an array would print the odd numbered pixels, while the nozzles from the other row of the array would print the even numbered pixels.

In fluid communication with each nozzle array is a corresponding ink delivery pathway. Ink delivery pathway 122 is in fluid communication with the first nozzle array 120, and ink delivery pathway 132 is in fluid communication with the second nozzle array 130. Portions of ink delivery pathways 122 and 132 are shown in FIG. 1 as openings through printhead die substrate 111. One or more inkjet printhead die 110 will be included in inkjet printhead 100, but for greater clarity only one inkjet printhead die 110 is shown in FIG. 1. The printhead die are arranged on a support member as discussed below relative to FIG. 2. In FIG. 1, first fluid source 18 supplies ink to first nozzle array 120 via ink delivery pathway 122, and second fluid source 19 supplies ink to second nozzle array 130 via ink delivery pathway 132. Although distinct fluid sources 18 and 19 are shown, in some applications it may be beneficial to have a single fluid source supplying ink to both the first nozzle array 120 and the second nozzle array 130 via ink delivery pathways 122 and 132 respectively. Also, in some embodiments, fewer than two or more than two nozzle arrays can be included on printhead die 110. In some embodiments, all nozzles on inkjet printhead die 110 can be the same size, rather than having multiple sized nozzles on inkjet printhead die 110.

The drop forming mechanisms associated with the nozzles are not shown in FIG. 1. Drop forming mechanisms can be of a variety of types, some of which include a heating element to vaporize a portion of ink and thereby cause ejection of a droplet, or a piezoelectric transducer to constrict the volume of a fluid chamber and thereby cause ejection, or an actuator which is made to move (for example, by heating a bi-layer element) and thereby cause ejection. In any case, electrical pulses from electrical pulse source 16 are sent to the various drop ejectors according to the desired deposition pattern. In the example of FIG. 1, droplets 181 ejected from the first nozzle array 120 are larger than droplets 182 ejected from the second nozzle array 130, due to the larger nozzle opening area. Typically other aspects of the drop forming mechanisms (not shown) associated respectively with nozzle arrays 120 and 130 are also sized differently in order to optimize the drop ejection process for the different sized drops. During operation, droplets of ink are deposited on a recording medium 20.

Figure 2:
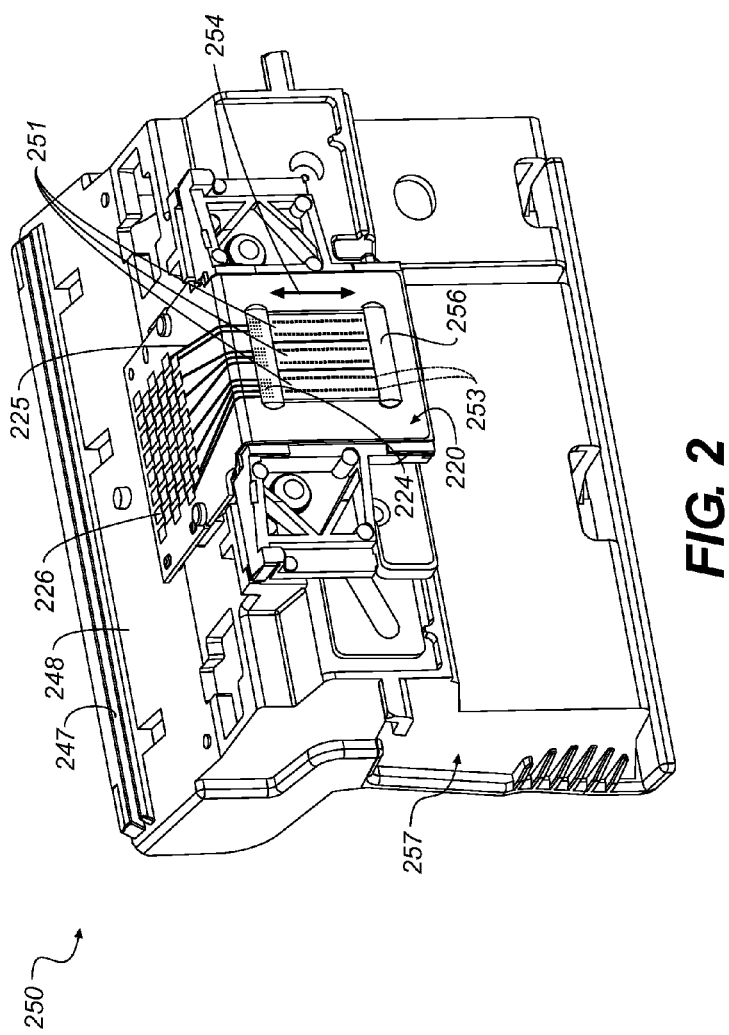
FIG. 2 is a perspective view of a portion of a printhead of the present invention.

FIG. 2 shows a perspective view of a portion of a printhead 250, which is an example of an inkjet printhead 100. Printhead 250 includes three printhead die 251 (similar to printhead die 110 in FIG. 1), each printhead die 251 containing two nozzle arrays 253 so that printhead 250 contains six nozzle arrays 253 altogether. The six nozzle arrays 253 in this example can each be connected to separate ink sources (not shown in FIG. 2); such as cyan, magenta, yellow, text black, photo black, and a colorless protective printing fluid. Each of the six nozzle arrays 253 is disposed along nozzle array direction 254, and the length of each nozzle array along the nozzle array direction 254 is typically on the order of 1 inch or less. Typical lengths of recording media are 6 inches for photographic prints (4 inches by 6 inches) or 11 inches for paper (8.5 by 11 inches). Thus, in order to print a full image, a number of swaths are successively printed while moving printhead 250 across the recording medium 20. Following the printing of a swath, the recording medium 20 is advanced along a media advance direction that is substantially parallel to nozzle array direction 254.

Figure 7:
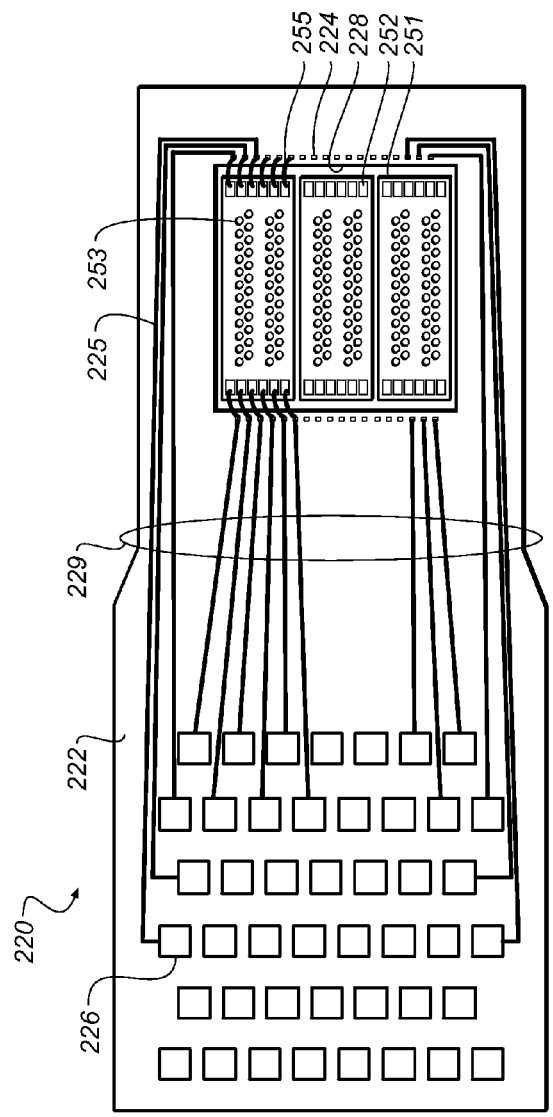
FIG. 7 is a schematic top view of several printhead die that are wire bonded to the printed wiring member of FIG. 6 of the present invention.

Referring to FIGS. 2 and 7, there is shown a printed wiring member 220, flexible in this embodiment, to which the printhead die 251 are electrically interconnected as described in detail below. It is noted for clarity that the printed wiring member 220 may be flexible or rigid as discussed in detail below. The printed wiring member 220 is affixed to printhead body 257 of printhead 250 and bends around an edge of printhead body 257. Conductor traces 225 extend from contact pads 224 to connector pads 226. Encapsulant 256 (typically thermally cured) encapsulates the contact pads and the wire bonds to form a protective covering. When printhead 250 is mounted into the carriage 200 (see FIGS. 3 and 4), the array of connector pads 226 are electrically connected to a corresponding array of pins on electrical connector 244 on the carriage 200 so that electrical signals can be transmitted to the printhead die 251.

Figure 3:
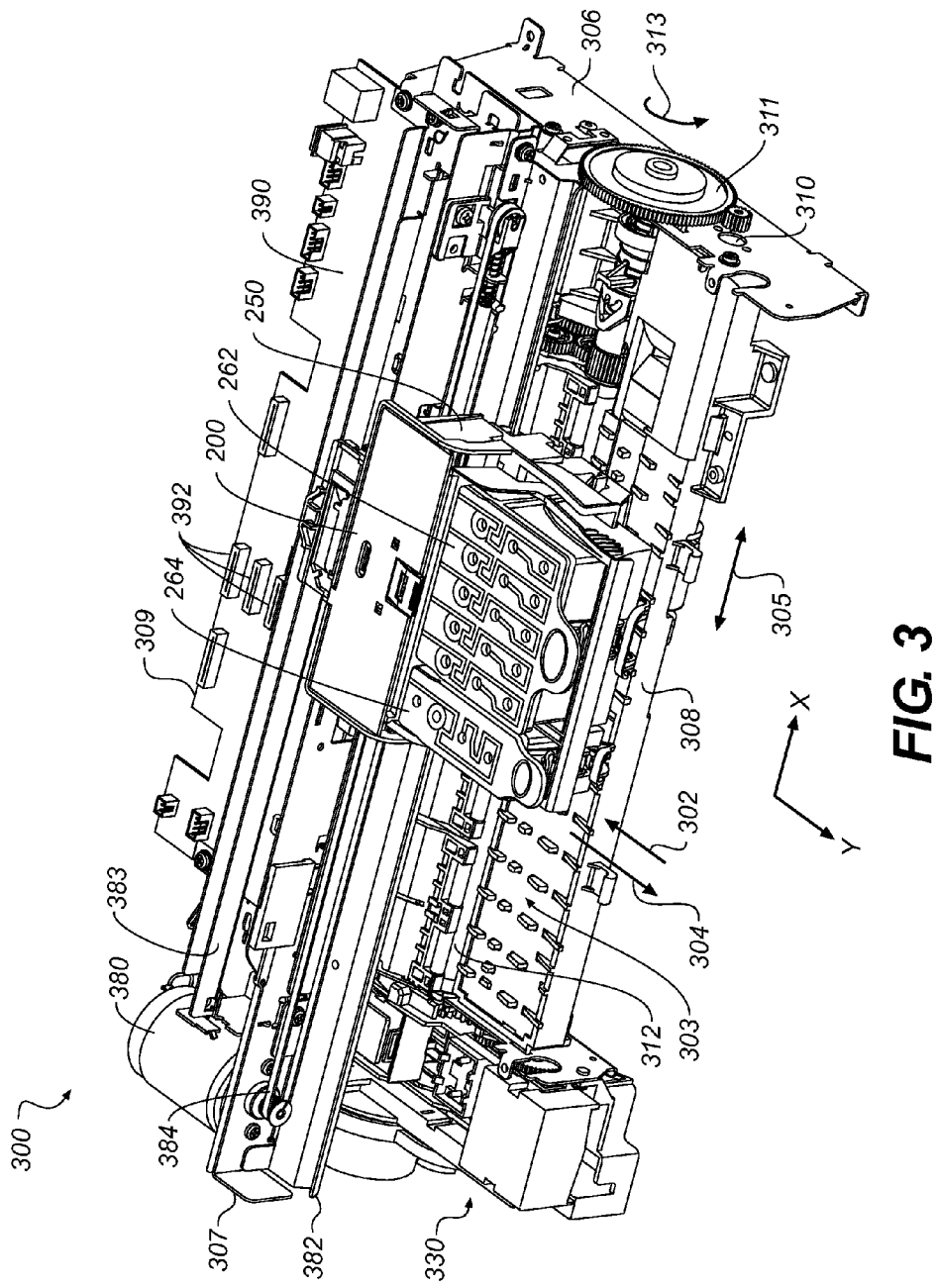
FIG. 3 is a perspective view of a portion of a carriage printer of the present invention.

FIG. 3 shows a portion of a desktop carriage printer. Some of the parts of the printer have been hidden in the view shown in FIG. 3 so that other parts can be more clearly seen. Printer chassis 300 has a print region 303 across which carriage 200 is moved back and forth in carriage scan direction 305 along the X axis, between the right side 306 and the left side 307 of printer chassis 300, while drops are ejected from printhead die 251 (not shown in FIG. 3) on printhead 250 that is mounted on carriage 200. Carriage motor 380 moves belt 384 to move carriage 200 along carriage guide rail 382. An encoder sensor (not shown) is mounted on carriage 200 and indicates carriage location relative to an encoder fence 383.

Figure 4:
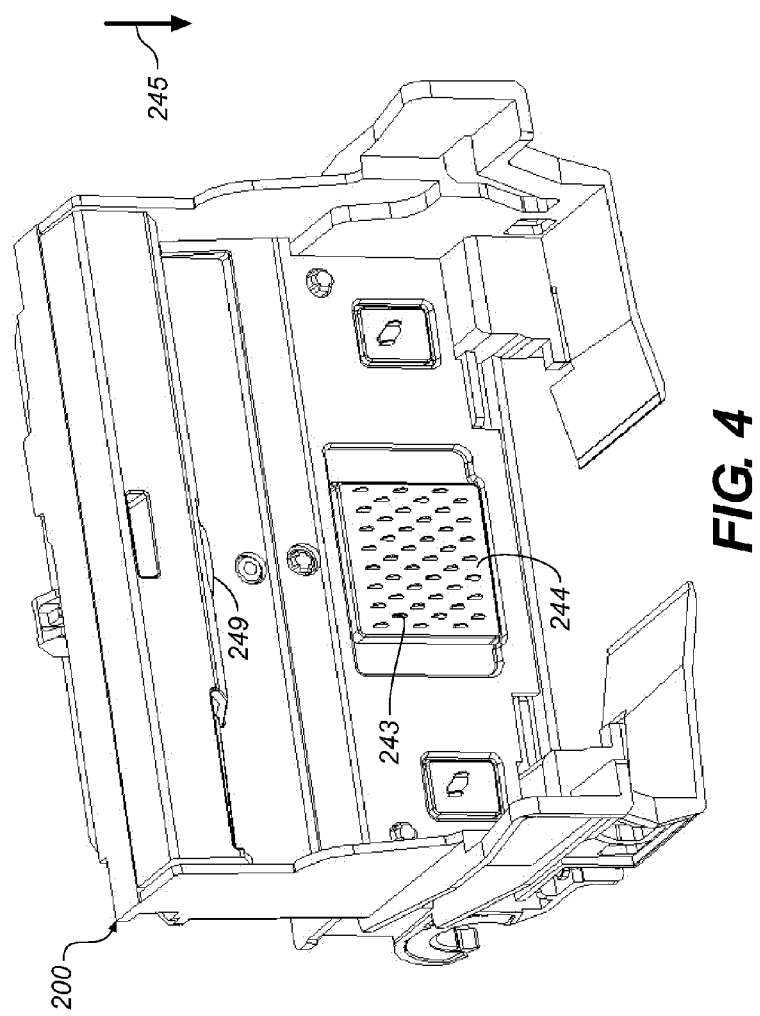
FIG. 4 is a perspective view of a carriage of the present invention.

Printhead 250 is mounted in carriage 200, and multi-chamber ink supply 262 and single-chamber ink supply 264 are mounted in the printhead 250. FIG. 4 shows carriage 200 without printhead 250 installed, in order to show connector 244 that connects to connector pads 226 of FIG. 2. In FIG. 3, the mounting orientation of printhead 250 is rotated relative to the view in FIG. 2 so that the printhead die 251 are located at the bottom side of printhead 250, the droplets of ink being ejected downward onto the recording medium in print region 303 in the view of FIG. 3. Multi-chamber ink supply 262, in this example, contains five ink sources: cyan, magenta, yellow, photo black, and colorless protective fluid; while single-chamber ink supply 264 contains the ink source for text black. Paper or other recording medium (sometimes generically referred to as paper or media herein) is loaded along paper load entry direction 302 toward the front of printer chassis 308.

Figure 5:
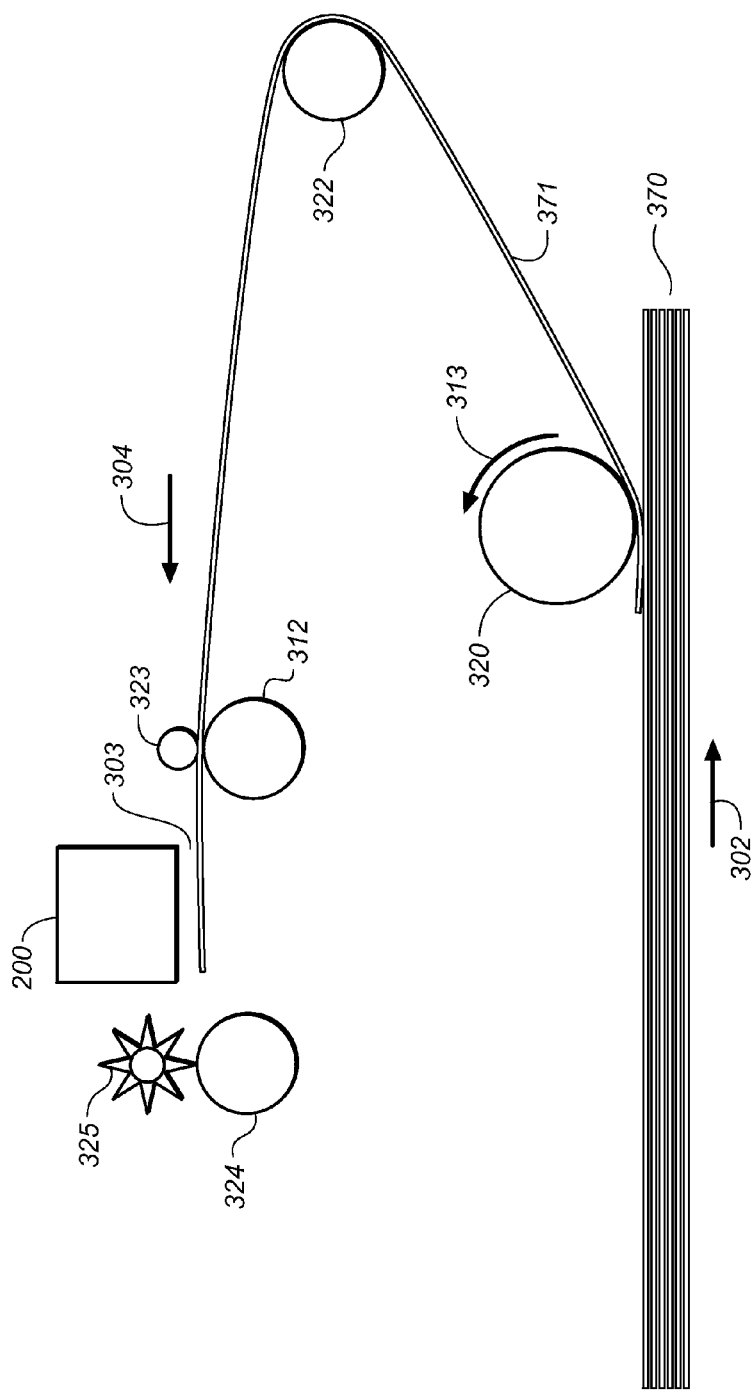
FIG. 5 is a schematic side view of an exemplary paper path in a carriage printer of the present invention.

A variety of rollers are used to advance the medium through the printer as shown schematically in the side view of FIG. 5. In this example, a pick-up roller 320 moves the top piece or sheet 371 of a stack 370 of paper or other recording medium in the direction of arrow, paper load entry direction 302. A turn roller 322 acts to move the paper around a C-shaped path (in cooperation with a curved rear wall surface) so that the paper continues to advance along media advance direction 304 from the rear 309 of the printer chassis (with reference also to FIG. 3). The paper is then moved by feed roller 312 and idler roller(s) 323 to advance along the Y axis across print region 303, and from there to a discharge roller 324 and star wheel(s) 325 so that printed paper exits along media advance direction 304. Feed roller 312 includes a feed roller shaft along its axis, and feed roller gear 311 is mounted on the feed roller shaft. Feed roller 312 can include a separate roller mounted on the feed roller shaft, or can include a thin high friction coating on the feed roller shaft. A rotary encoder (not shown) can be coaxially mounted on the feed roller shaft in order to monitor the angular rotation of the feed roller.

The motor that powers the paper advance rollers is not shown in FIG. 3, but the hole 310 at the right side of the printer chassis 306 is where the motor gear (not shown) protrudes through in order to engage feed roller gear 311, as well as the gear for the discharge roller (not shown). For normal paper pick-up and feeding, it is desired that all rollers rotate in forward rotation direction 313. Toward the left side of the printer chassis 307, in the example of FIG. 3, is the maintenance station 330.

Toward the rear of the printer chassis 309, in this example, is located the electronics board 390, which includes cable connectors 392 for communicating via cables (not shown) to the printhead carriage 200 and from there to the printhead 250. Also on the electronics board are typically mounted motor controllers for the carriage motor 380 and for the paper advance motor, a processor and/or other control electronics (shown schematically as controller 14 image processing unit 15 in FIG. 1) for controlling the printing process, and an optional connector for a cable to a host computer.

Figure 6:
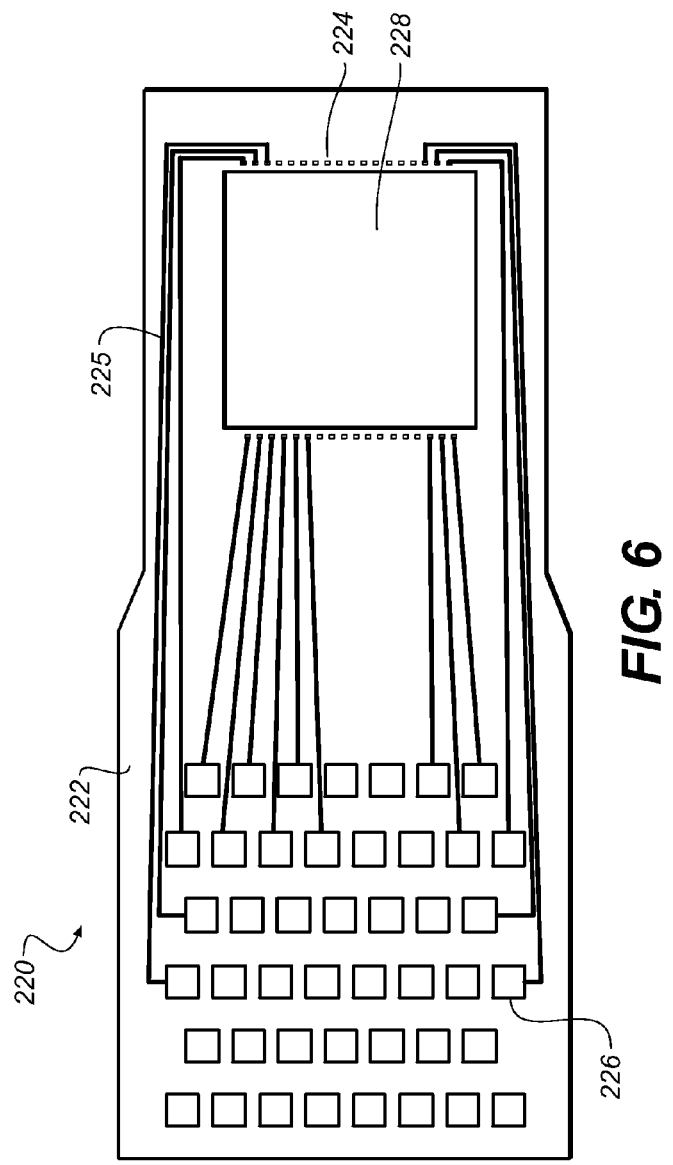
FIG. 6 is a schematic top view of a printed wiring member according to an embodiment of the invention of the present invention.

FIG. 6 shows a schematic top view of a printed wiring member 220 according to an embodiment of the present invention. Printed wiring member 220 is formed on a dielectric substrate 222. For embodiments where printed wiring member 220 bends around a corner as seen in FIG. 2, dielectric substrate 222 needs to be flexible. Flexible dielectric substrates include materials such as polyimide or polyether ether ketone (PEEK). In other embodiments where the printed wiring member 220 is planar (i.e., flat or substantially flat), the dielectric substrate 222 can be a rigid material such as woven glass impregnated with epoxy resin. Printed wiring member 220 includes contact pads 224, connector pads 226, and conductor traces 225 to provide conductive paths between contact pads 224 and connector pads 226. For simplicity, not all of the conductor traces 225 between contact pads 224 and connector pads 226 are shown in FIG. 6. In this example, printed wiring member 220 also includes an opening 228.

Contact pads 224, connector pads 226 and conductor traces 225 are generally copper, with other metallizations deposited on the copper as needed. For clarity of the present invention, a brief description of prior art printed wiring members is described in this paragraph. In this regard, typically the contact pads and connector pads have several microns of nickel plated on the copper and a thin layer of gold plated on the nickel. The gold layer, which is typically about 0.5 micron thick for the case of electroplated soft gold or about 0.1 micron thick for electrolessly plated gold, is conventionally used as a bonding metallization surface for the contact pads, and as a corrosion resistant surface for connector pads. Conventionally, gold for contact pads is required to be high purity soft gold for reliable bondability of wire bonds to the contact pads. Conventionally, gold for connector pads is preferably hard gold alloyed with approximately 0.1% to 0.3% cobalt and/or nickel in order to provide wear resistance for connector pads so that repeated connection cycles are reliable. Conductor traces can also be coated with other metals, or they can just be copper.

Returning to the description of the present invention, FIG. 7 shows a schematic top view of printed wiring member 220 in relationship with three printhead die 251 which have been bonded within opening 228 of printed wiring member 220. Each printhead die 251 includes bond pads 252 at both ends, as well as nozzle arrays 253. For simplicity, wire bonds 255 are only shown for the upper printhead die 251 in FIG. 7. Wire bonds 255 are typically aluminum and are ultrasonically welded at one end to bond pads 252 and at the other end to contact pads 224 on printed wiring member 220. If the printed wiring member 220 is used in a printhead configuration such as that shown in FIG. 2, where the printhead die 251 are on one surface and the connector pads are on another surface, it is required that the dielectric substrate 222 of the printed wiring member 220 be flexible enough to bend in a region 229 including connector traces 225. In some embodiments, other electrical components can be bonded (for example by solder bonding) to the printed wiring member to form a printed circuit. In such embodiments, the metallization of the solder bond site needs to be conducive to reliable solder bonding.

Figure 8:
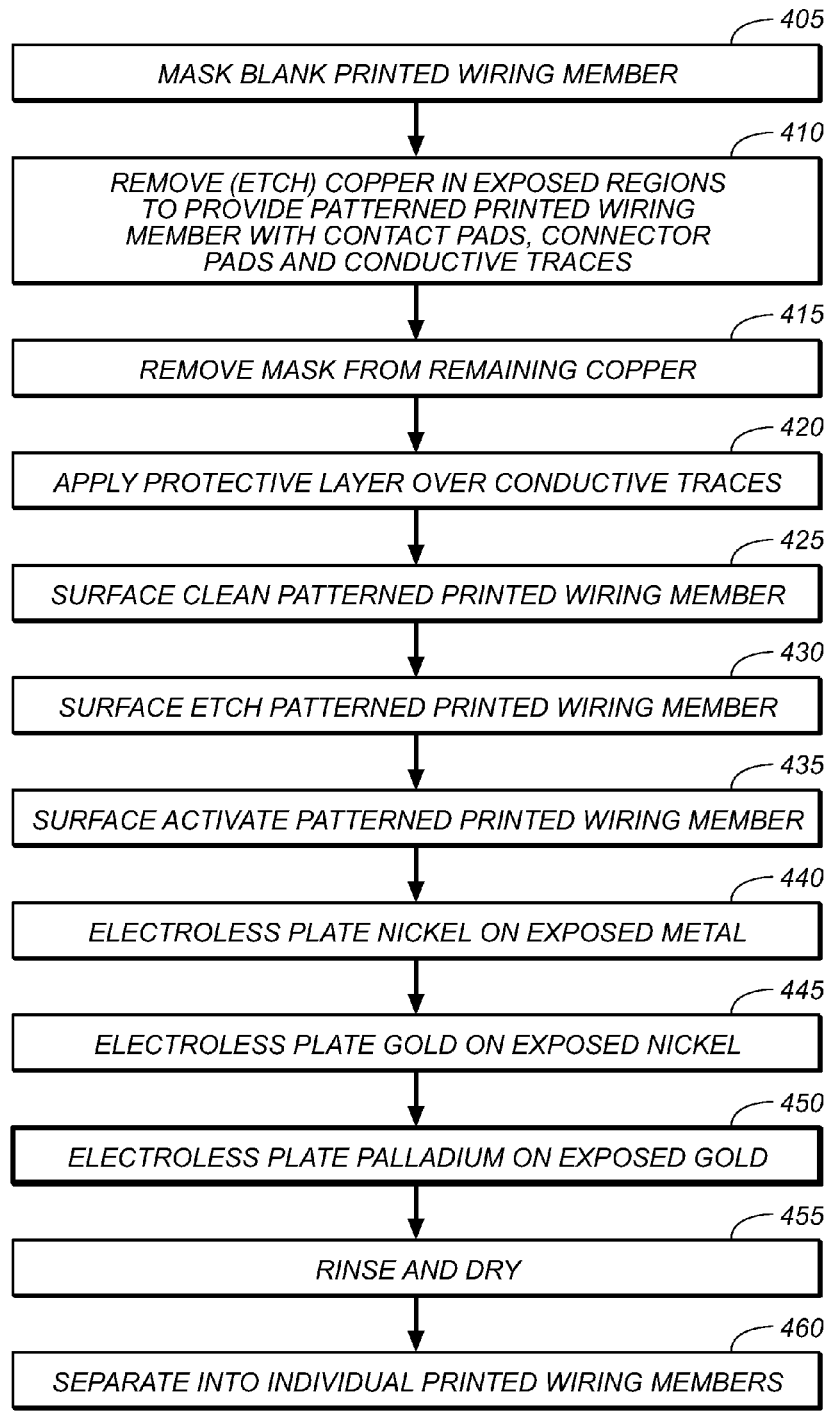
FIG. 8 is a process flow chart for making printed wiring members according to an embodiment of the present invention.

FIG. 8 shows a process flow chart for making printed wiring member 220 in a preferred embodiment. The steps denoted 405, 410, 415 and 420 are steps typically used in patterning the copper on the printed wiring member. The steps denoted 425, 430, 435, 440 and 445 are steps that are commonly used to provide electroless nickel/immersion gold (also called ENIG metallization). The steps denoted 455 and 460 are typical finishing operations in making printed wiring members. It is step 450 (highlighted with bold outline in FIG. 8), i.e., electroless plating of palladium over the gold (deposited in the step denoted 445) that provides the wear resistance for the connector pads 226 without compromising the bondability of the contact pads 224 of the present invention.

As is well known in the art, fabrication of a printed wiring member 220 typically begins with a blank printed wiring member that includes a thin copper foil laminated to the dielectric substrate 222. Generally the blank printed wiring member is significantly larger than a single printed wiring member 220. Many printed wiring members 220 are typically fabricated in a panel of blank printed wiring material, and then cut apart after fabrication is completed. Regions where copper is desired to remain are masked photolithographically (step denoted 405). Copper is removed in the exposed (nonmasked) regions, typically by etching (step denoted 410) to provide a patterned printed wiring member having contact pads, connector pads and conductive traces formed from the copper foil. The mask is then stripped from the copper that remains (step denoted 415). Copper is not suited for direct wire bonding contact pads or for connector pads so typically a diffusion barrier layer of nickel and a top layer of gold are plated over the copper. Optionally, a protective organic dielectric layer is applied over the copper conductive traces to mask them (step denoted 420) so that the nickel and gold do not plate in these regions, thus saving material cost.

Although electroplating is commonly used to deposit the nickel and gold for many conventional printed wiring and printed circuit boards, a less complex and less costly method is electroless plating. An electroless plating method for applying nickel and gold over the copper is commercially available using a process called electroless nickel/immersion gold (ENIG). A particular example of the ENIG process is next described. At the step denoted 425, the patterned printed wiring member (or panel) is immersed in a bath for surface cleaning. The bath can be an ammonium citrate ($NH_4$ citrate) solution at 55° C. for example, followed by a room temperature rinse in water. The surface-cleaned printed wiring member is then surface etched at the step denoted 430. The surface etch can be done in a sodium bisulfate ($NaHSO_4$) solution with 2% sulfuric acid ($H_2SO_4$), for example, followed by a room temperature rinse in water. A surface activation step is next performed at the step denoted 430. The surface activation step can be done by electroless plating a thin layer of palladium on the exposed copper in an aqueous palladium sulfate solution ($PdSO_4$) with 1% sulfuric acid, for example, followed by a room temperature water rinse. The palladium deposited at the surface activation step is typically approximately 0.03 micron thick and helps to catalyze the surface for subsequent nickel electroless plating. A nickel coating is then deposited on the exposed metal of the patterned printed wiring member using an electroless nickel deposition process at the step denoted 440. Nickel electroless plating can be done, for example, in a phosphorus-containing bath such as $Ni(H_2PO_2)_2$ (nickel hypophosphite) at 80° C. at a pH of 4.5, followed by a room temperature water rinse. The nickel coating typically contains at least 2% phosphorous and is usually about 2 to 4 microns thick. (In an alternative nickel coating process over the palladium catalyzed copper, the nickel can be as thin as a few atomic layers, i.e. less than 0.01 micron thick.) A gold layer is then deposited on the exposed nickel using an electroless gold deposition process at the step denoted 445. Gold electroless plating can be done in a solution containing gold ions, for example in a solution including gold cyanide (AuCN), ammonium citrate ($NH_4$ citrate) and disodium ethylenediamine tetraacetic acid ($Na_2$ EDTA) at 80° C. at a pH of 4.5, followed by a room temperature water rinse. In this step, gold from the solution replaces nickel at or near the surface of the nickel coating. The gold layer thickness is approximately 0.05 to 0.2 micron and is typically softer than is preferable for wear resistant connector pads. The gold layer can be porous. Steps 425-445 thus provide the ENIG metallization.

The differentiating step of the present invention that provides wear-resistance to the connector pads 226 without compromising the bondability of the contact pads 224 is the step denoted 450 in which palladium is deposited on the exposed gold layer by an electroless plating step. The electroless plating of palladium on the gold can be done in a solution containing palladium ions using an aqueous palladium sulfate solution ($PdSO_4$) with 1% sulfuric acid, for example, as was done in the previously performed surface activation step denoted 435. It has been observed that palladium is not readily electrolessly plated on soft gold that has been electroplated to a thickness of about 0.5 micron. Without being bound by theory, it is thought that pores in the electroless gold layer deposited in the step denoted 445 allow access by the palladium sulfate solution to the nickel/phosphorous coating for ion exchange and chemical reduction of the palladium ions in the palladium sulfate solution. The palladium can be deposited in a noncontinuous layer on the gold, particularly for short plating times and/or low concentrations of palladium in the solution. At longer plating times, the noncontinuous regions tend to merge to provide a continuous layer on the gold. A time duration of the electroless plating of palladiuim over the gold between about 5 seconds and about 10 minutes, more preferably between 20 seconds and 150 seconds, and even more preferably between 45 seconds and 90 seconds, has been shown to provide improved wear resistance of the connector pads 226 if the electroless plating of palladium is done at room temperature. It is not required that electroless plating of palladium occur at room temperature, but it simplifies the process in some embodiments. The preferred duration of the palladium electroless plating step also depends partly on the concentration of palladium in solution. The nominal time durations cited above are for a palladium concentration of about 100 ppm. For higher concentration of palladium, shorter plating times can be used for equivalent amount of palladium deposited. Thickness of the palladium on the gold is typically between 0.02 micron and 0.2 micron. X-ray photoelectron spectroscopy analysis of a printed wiring member that was fabricated as described above with electroless palladium on the gold layer indicates that the palladium is substantially all metallic (i.e. $Pd^0$) rather than ionic (i.e. $Pd^{+2}$). In other words, the palladium deposit on the gold layer is greater than 90% metallic palladium and less than 10% ionic palladium After the electroless plating of the palladium on the gold, the panel of printed wiring members is rinsed and dried (step denoted 455) and separated into a plurality of printed wiring members 220, for example by cutting, in the step denoted 460. Optionally the printed wiring member 220 is also plasma cleaned.

Additional tests were performed on printed wiring members fabricated as described above with electroless palladium deposited on the gold layer. Contact pads were readily wire bondable. Wire pull tests indicated breakage at the bond heel, rather than lifting of the bond foot, even after an 18 hour thermal cycle to 150° C. Focused ion beam analysis revealed gold and palladium diffusion into the aluminum wire at the bond interface. This is similar to the diffusion of gold into aluminum for a wire bonded to ENIG metallization, suggesting that the wire bond is strong at the atomic level.

A primary function of the palladium over the gold is to increase the wear resistance of the connector pads 226. In the embodiment described above, palladium is electrolessly deposited over the gold on contact pads 224 as well as connector pads 226. However, in some embodiments, the palladium is only electrolessly deposited over the gold on the connector pads 226.

In an inkjet printer, such as the one shown in FIG. 3, where a printhead 250 is replaceably installed in a carriage 200 (see also FIG. 4), electrical connector 244 has an array of spring-loaded pins 243 for making electrical connection with connector pads 226 of printed wiring member 220 (FIG. 6). The connector pads 226 are disposed on a substantially flat surface of the printhead body 257, but in some embodiments, the printed wiring member 220 is mounted in a non-rigid fashion on printhead body 257, such that the connector pad region of printed wiring member 220 can move somewhat. When printhead 250 (similar to that shown in FIG. 2) is installed in carriage 200, pins 243 move inward somewhat into electrical connector 244. In other words, they move substantially perpendicular to the plane of the plurality of connector pads 226. During installation, printhead 250 is first moved in printhead installation direction 245 (FIG. 4), and then the inside of printhead 250 (an inner face corresponding to outside face 248) is rocked toward carriage 200 until lip 247 of printhead 250 is latched by latch 249 of carriage 200. During the rocking motion, the connector pads 226 are wiped by corresponding pins 243. Such a wiping motion is preferred for establishing a reliable connection. However, if the wiping motion is too severe or the metallization of connector pads 226 is too soft, repeated wipings occurring during repetitive installations can wipe away sufficient metallization on the connector pads 226 that future electrical connection during printhead installation can become unreliable. The present invention of depositing palladium on top of the gold provides a more wear resistant coating of the connector pads 226 so that they can withstand more than 20 cycles of the printhead 250 into carriage 200 without causing excessive wear on the connector pads 226.

The invention has been described in detail with particular reference to certain preferred embodiments thereof, but it will be understood that variations and modifications can be effected within the spirit and scope of the invention.

PARTS LIST

10 Inkjet printer system
12 Image data source

14 Controller
15 Image processing unit
16 Electrical pulse source
18 First fluid source
19 Second fluid source
20 Recording medium
100 Inkjet printhead
110 Inkjet printhead die
111 Substrate
120 First nozzle array
121 Nozzle(s)
122 Ink delivery pathway (for first nozzle array)
130 Second nozzle array
131 Nozzle(s)
132 Ink delivery pathway (for second nozzle array)
181 Droplet(s) (ejected from first nozzle array)
182 Droplet(s) (ejected from second nozzle array)
200 Carriage
220 Printed wiring member
222 Dielectric substrate
224 Contact pads
225 Conductor traces
226 Connector pads
228 Opening
229 Bend region
243 Pin
244 Electrical connector
245 Printhead installation direction
247 Lip
248 Outside face
249 Latch
250 Printhead
251 Printhead die
252 Bond Pads
253 Nozzle array
254 Nozzle array direction
255 Wire bond
256 Encapsulant
257 Printhead Body
262 Multi-chamber ink supply
264 Single-chamber ink supply
300 Printer chassis
302 Paper load entry direction
303 Print region
304 Media advance direction
305 Carriage scan direction
306 Right side of printer chassis
307 Left side of printer chassis
308 Front of printer chassis
309 Rear of printer chassis
310 Hole (for paper advance motor drive gear)
311 Feed roller gear
312 Feed roller
313 Forward rotation direction (of feed roller)
320 Pick-up roller
322 Turn roller
323 Idler roller
324 Discharge roller
325 Star wheel(s)
330 Maintenance station
370 Stack of media
371 Top piece of medium
380 Carriage motor
382 Carriage guide rail
383 Encoder fence
384 Belt
390 Printer electronics board
392 Cable connectors
405-460 Steps (in fabrication process)

The invention claimed is:
1. A printed wiring member comprising:
   a) a dielectric substrate;
   b) a patterned copper layer formed on the dielectric substrate, the patterned copper layer including:
      i) contact pads for wire bonding;
      ii) connector pads for making electrical connection with an electrical connector; and
      iii) conductor traces between contact pads and corresponding connector pads;
   c) a nickel coating formed on the contact pads and the connector pads;
   d) a gold layer formed on the nickel coating on the contact pads and the connector pads; and
   e) a palladium deposit formed on the gold layer on at least the connector pads.
2. The printed wiring member as in claim 1, wherein the dielectric substrate is a flexible dielectric substrate.
3. The printed wiring member as in claim 1, wherein the dielectric substrate is a rigid dielectric substrate.
4. The printed wiring member as in claim 1, wherein the palladium deposit is formed on both the contact pads and connector pads.
5. The flexible printed wiring member of claim 1, wherein the nickel coating includes a coating thickness less than 4 microns.
6. The flexible printed wiring member of claim 1, wherein the gold layer includes a layer thickness between 0.05 micron and 0.2 micron.
7. The flexible printed wiring member of claim 1, wherein the palladium deposit includes a deposit thickness between 0.02 micron and 0.2 micron.
8. The flexible printed wiring member of claim 1, wherein the palladium deposit comprises greater than 90% metallic palladium and less than 10% ionic palladium.
9. The flexible printed wiring member of claim 1, wherein the nickel coating includes at least 2% phosphorus.
10. The flexible printed wiring member of claim 1 further comprising a bend in a region including the conductor traces.
11. An inkjet printhead comprising:
   a) a printhead body;
   b) a printhead die including a nozzle array and bond pads; and
   c) a flexible printed wiring member affixed to the printhead body, the flexible printed wiring member including:
      i) a plurality of contact pads that are bonded to the bond pads of the printhead die;
      ii) a plurality of connector pads for electrically connecting the printhead to a printing system; and
      iii) conductor traces connecting corresponding contact pads and connector pads, wherein at least the connector pads include a deposit of palladium over a layer of gold over a coating of nickel.
12. The inkjet printhead as in claim 11, wherein both the connector pads and the contact pads include a deposit of palladium.
13. The inkjet printhead of claim 11, wherein the nickel coating includes a coating thickness less than 4 microns.
14. The inkjet printhead of claim 11, wherein the gold layer includes a layer thickness between 0.05 micron and 0.2 micron.
15. The inkjet printhead of claim 11, wherein the palladium deposit includes a deposit thickness between 0.02 micron and 0.2 micron.

16. The inkjet printhead of claim 11, wherein the palladium deposit comprises greater than 90% metallic palladium and less than 10% ionic palladium.

17. The inkjet printhead of claim 11, wherein the nickel coating includes at least 2% phosphorus.

18. The inkjet printhead of claim 11 further comprising a bend in a region of the flexible printed wiring member including the conductor traces, wherein the printhead die is disposed on a first surface of the printhead body and the connector pads are disposed on a second surface of the printhead body.

19. The inkjet printhead of claim 11, wherein the plurality of contact pads are bonded to the bond pads of the printhead die with aluminum wire bonds.

20. An inkjet printing system comprising:
a) a replaceable printhead including:
i) a printhead body;
ii) a printhead die including a nozzle array and bond pads; and
iii) a flexible printed wiring member affixed to the printhead body, the flexible printed wiring member including a plurality of contact pads that are bonded to the bond pads of the printhead die, and a plurality of connector pads for electrically connecting the printhead to the inkjet printing system, wherein at least the connector pads include a deposit of palladium over a layer of gold over a coating of nickel; and
b) an electrical connector including a plurality of spring-loaded pins for making electrical connection with the plurality connector pads of the replaceable printhead when the replaceable printhead is installed.

21. The inkjet printing system as in claim 20, wherein both the connector pads and contact pads include a deposit of palladium over a layer of gold over a coating of nickel.

22. The inkjet printing system of claim 20, wherein the plurality of connector pads are disposed on a substantially flat surface of the printhead body, and the spring-loaded pins are disposed to move substantially perpendicular to the plurality of connector pads when the replaceable printhead is installed.

23. The inkjet printing system of claim 20 wherein the spring-loaded pins are configured to provide a wiping motion on the connector pads.

24. The inkjet printing system of claim 20, wherein the printhead can be installed and uninstalled more than 20 times without causing excessive wear on the plurality of connector pads.

* * * * *